(12) United States Patent
Doogue et al.

(10) Patent No.: US 8,773,123 B2
(45) Date of Patent: Jul. 8, 2014

(54) TWO-TERMINAL LINEAR SENSOR

(75) Inventors: Michael C. Doogue, Manchester, NH (US); Jonathan Lamarre, Raleigh, NC (US); Monica J. Thomas, Farmington, ME (US)

(73) Assignee: Allegro Microsystems, LLC, Worcester, MA (US)

( * ) Notice: Subject to any disclaimer, the term of this patent is extended or adjusted under 35 U.S.C. 154(b) by 158 days.

(21) Appl. No.: 13/239,587

(22) Filed: Sep. 22, 2011

(65) Prior Publication Data

US 2012/0013327 A1 Jan. 19, 2012

Related U.S. Application Data

(62) Division of application No. 12/043,464, filed on Mar. 6, 2008, now Pat. No. 8,054,071.

(51) Int. Cl.
*G01R 33/07* (2006.01)
*G01R 19/00* (2006.01)

(52) U.S. Cl.
USPC .......................... 324/251; 324/207.2; 702/64

(58) Field of Classification Search
USPC ........................................................ 324/251
See application file for complete search history.

(56) References Cited

U.S. PATENT DOCUMENTS

| | | | |
|---|---|---|---|
| 4,071,813 A | 1/1978 | Dobkin | |
| 4,374,333 A | 2/1983 | Avery | |
| 4,645,950 A | 2/1987 | Carvajal | |
| 4,687,994 A | 8/1987 | Fulkerson et al. | |
| 4,791,311 A | 12/1988 | Vig | |
| 5,017,804 A | 5/1991 | Harnden et al. | |
| 5,055,781 A | 10/1991 | Sakakibara et al. | |
| 5,218,298 A | 6/1993 | Vig | |
| 5,412,255 A | 5/1995 | Wallrafen | |
| 5,686,894 A | 11/1997 | Vig et al. | |
| 6,091,238 A | 7/2000 | McDermott | |
| 6,118,260 A | 9/2000 | Kirkpatrick, II et al. | |
| 6,154,027 A * | 11/2000 | Alexander et al. | 324/251 |
| 6,297,627 B1 | 10/2001 | Towne et al. | |
| 6,437,581 B1 | 8/2002 | Blossfeld | |

(Continued)

FOREIGN PATENT DOCUMENTS

| | | |
|---|---|---|
| CN | 101076737 A | 11/2007 |
| DE | 40 14 885 A1 | 11/1990 |

(Continued)

OTHER PUBLICATIONS

Response to First Office Action dated Aug. 23, 2012 for Chinese Patent Application No. 200980107300.7, Response filed Jan. 21, 2012, 4 pages.

(Continued)

*Primary Examiner* — Bot Ledynh
(74) *Attorney, Agent, or Firm* — Daly, Crowley, Mofford & Durkee, LLC

(57) ABSTRACT

A magnetic field sensor includes a linear magnetic field sensor to produce a voltage proportional to a sensed magnetic field and an interface having only two terminals for external connections. The two terminals of the interface include a power supply terminal and a ground terminal. The interface includes a voltage-controlled current generating device that is connected between the two terminals and is controlled by the voltage to provide a current signal that is proportional to the sensed magnetic field.

9 Claims, 3 Drawing Sheets

(56) References Cited

U.S. PATENT DOCUMENTS

| | | | |
|---|---|---|---|
| 6,476,602 B1 * | 11/2002 | Gray | 324/210 |
| 6,563,419 B1 | 5/2003 | Herz et al. | |
| 6,815,944 B2 | 11/2004 | Vig et al. | |
| 7,026,808 B2 | 4/2006 | Vig et al. | |
| 7,573,112 B2 | 8/2009 | Taylor | |
| 8,054,071 B2 | 11/2011 | Doogue et al. | |
| 2002/0153885 A1 | 10/2002 | Blossfeld | |
| 2003/0052657 A1 | 3/2003 | Koernle et al. | |
| 2005/0285581 A1 * | 12/2005 | Hayakawa | 323/282 |
| 2006/0125488 A1 | 6/2006 | Murphy et al. | |
| 2009/0224754 A1 | 9/2009 | Lamarre et al. | |
| 2009/0302837 A1 | 12/2009 | Phan Le et al. | |
| 2010/0085674 A1 | 4/2010 | Martins | |

FOREIGN PATENT DOCUMENTS

| | | |
|---|---|---|
| DE | 197 00 070 A1 | 7/1997 |
| DE | 112009000503 T5 | 9/2009 |
| EP | 1 679 524 A1 | 7/2006 |
| JP | 10 253728 | 9/1998 |
| JP | 2006 098171 | 4/2006 |
| JP | 2006-098171 | 4/2006 |
| WO | WO 2009/111168 A1 | 9/2009 |

OTHER PUBLICATIONS

Second Office Action dated May 2, 2013 for Chinese Patent Application No. 200980107300.7, 11 pages.

Notification of Transmittal of the International Search Report and the Written Opinion of the International Searching Authority, or the Declaration, with the International Search Report and the Written Opinion of the International Searching Authority, PCT/US2009/034449, date of mailing Jul. 2, 2009, 12 pages.

Notification Concerning Transmittal of Copy of International Preliminary Report on Patentability (Chapter 1 of the Patent Cooperation Treaty) with International Preliminary Report on Patentability, PCT/US2009/034449, date of mailing Sep. 16, 2010, 8 pages.

U.S. Appl. No. 12/043,464, filed Mar. 6, 2008.

Notice of Reasons for Rejection dated Mar. 18, 2013 for Japanese Application No. 2010-549702, filed Aug. 30, 2010, 3 pages.

Comments and Suggestions for Overcoming the Rejections (Appendix B) dated Dec. 12, 2013 for Chinese Application No. 200980107300.7, filed Sep. 1, 2010, 3 pages.

Response dated Feb. 20, 2014 to Third Office Action dated Nov. 20, 2013 for Chinese Application No. 200980107300.7, filed Sep. 1, 2010, 6 pages.

First Office Action with Search Report dated Aug. 23, 2012 (and translation), for Chinese Patent Application No. 200980107300.7, 14 pages.

Response filed with Appeal dated Sep. 27, 3013 for Japanese Application No. 2010-549702, filed Aug. 30, 2010, 11 pages.

Third Office Action dated Nov. 20, 2013 for Chinese Application No. 200980107300.7, filed Sep. 1, 2010, 7 pages.

Office Action and translation dated Mar. 20, 2014 for Korean Application No. 10-2010-7017859, filed Aug. 12, 2010, 7 pages.

* cited by examiner

TWO-TERMINAL LINEAR SENSOR

CROSS-REFERENCE TO RELATED APPLICATIONS

This application is a divisional of U.S. patent application Ser. No. 12/043,464 filed on Mar. 6, 2008, which is incorporated herein by reference.

STATEMENT REGARDING FEDERALLY SPONSORED RESEARCH

Not applicable.

FIELD OF THE INVENTION

This invention relates generally to magnetic field sensors and, in particular, to linear magnetic field sensors.

BACKGROUND OF THE INVENTION

Magnetic field sensors that generate an output voltage signal that is proportional to a magnetic field are well known. To date, such conventional linear magnetic field sensors use an output structure that requires a separate output connection in addition to power and ground connections. In an application, each interconnection contributes to overall cost and space requirements. In low-cost sensor applications, for example, automotive tachometers, magnet actuated alarm systems and the like, each interconnection may represent a significant cost.

SUMMARY OF THE INVENTION

In general, in one aspect, the invention is directed to a magnetic field sensor. The magnetic field sensor includes a linear magnetic field sensor to sense a magnetic field and to produce a voltage proportional to the sensed magnetic field. The magnetic field sensor further includes an interface having only two terminals including a power supply terminal and a ground terminal. The interface includes a voltage-controlled current generating device connected between the two terminals, controllable by the voltage to provide a current that is proportional to the sensed magnetic field.

Embodiments of the invention may include one or more of the following features. The linear magnetic field sensor may include a Hall-effect element or a magnetoresistive (MR) element to sense the magnetic field. The voltage-controlled current generating device may be operable as a current sink when the power supply terminal is connected to an external current sensing device or, alternatively, a current source when the ground terminal is connected to an external current sensing device. The voltage-controlled current generating device may include an operational amplifier coupled to a transistor. The linear magnetic field sensor and interface may be implemented in a single integrated circuit.

In another aspect, the invention is directed to a circuit that includes a linear magnetic field sensor and a current sensing device. The linear magnetic field sensor comprises an integrated circuit having only two terminals, a power terminal and a ground terminal. The current sensing device, which is connected to the linear magnetic field sensor, is usable to measure a current that is proportional to a magnetic field sensed by the linear magnetic field sensor.

BRIEF DESCRIPTION OF THE DRAWINGS

The foregoing features of the invention, as well as the invention itself may be more fully understood from the following detailed description of the drawings, in which.

Like reference numerals will be used to represent like elements.

DETAILED DESCRIPTION

Figure 1:
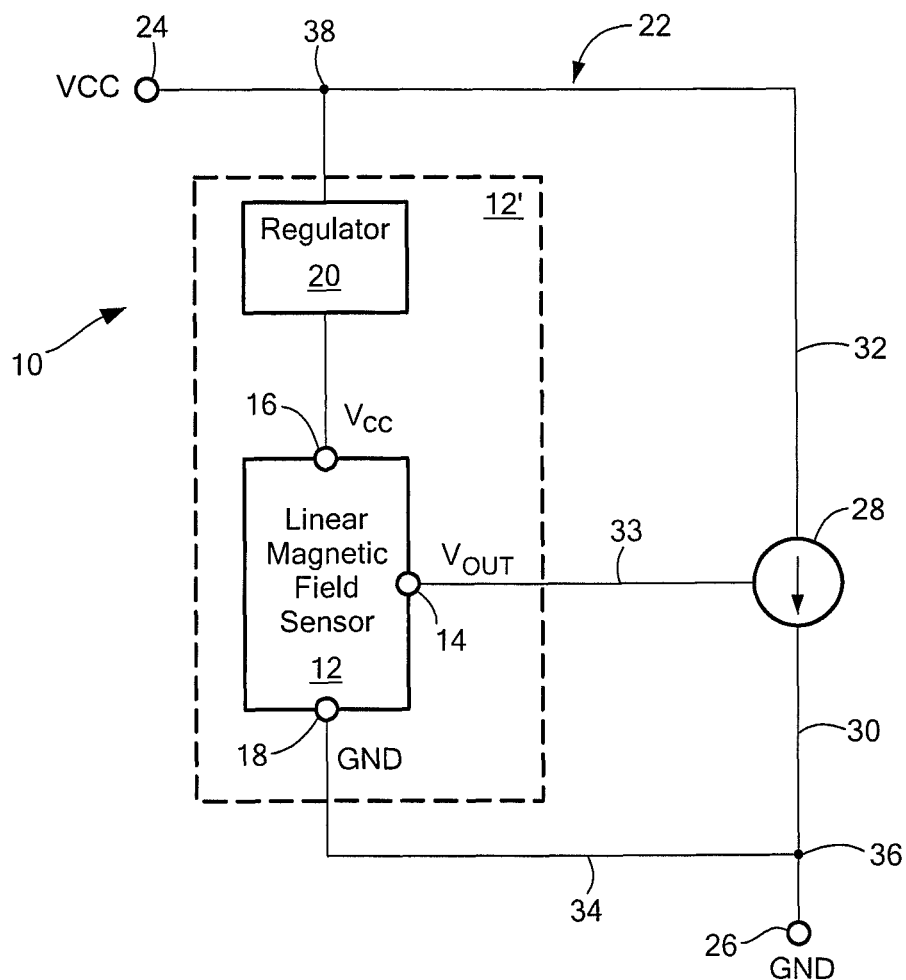
FIG. 1 shows an exemplary two-terminal linear magnetic field sensor that includes a three-terminal linear magnetic field sensor and a three-to-two-terminal interface that includes a voltage-controlled current generating device.

Referring to FIG. 1, a two-terminal transducer 10 that includes a transducer 12 having three terminals is shown. In one exemplary embodiment, as illustrated in FIG. 1, the transducer 10 is a two-terminal linear magnetic field sensor ("two-terminal sensor 10") and the transducer 12 is a three-terminal linear magnetic field sensor ("linear magnetic field sensor 12" or, simply, "sensor 12"). The term "terminal" as used herein refers to a position or contact point at which an external electrical connection can be (or is) made.

The sensor 12 operates to sense a magnetic field and to produce an output voltage that is proportional to the sensed magnetic field. More specifically, the output voltage changes proportionately to change in magnetic field strength. The output voltage (labeled "Vout") is provided at a first terminal, output terminal 14. Power is provided to the sensor 12 through a second terminal, VCC terminal 16. A connection to ground is provided to the sensor 12 through a third terminal, GND terminal 18. In the illustrated sensor, the VCC terminal 16 is connected to a voltage regulator 20. Thus, the supply voltage provided to VCC terminal 16 is a regulated voltage. In one embodiment, the sensor 12 may be implemented as an integrated circuit (IC), that is, a single chip electronic circuit. Alternatively, the voltage regulator 20 may be viewed as part of the sensor 12 architecture and thus included to form a sensor 12'. The sensor 12' may be implemented as an IC as well. In yet another alternative implementation, the entire two-terminal sensor 10 may be constructed as an IC. In a sensor IC, the terminals might correspond to device pins. If the sensor 12 or 12' is part of a larger IC, the terminals 14, 16 and 18 would be internal circuit nodes connecting the senor 12 or 12' to other circuitry of the two-terminal sensor 10. Hereinafter, references to sensor 12 will be taken to mean sensor 12 or sensor 12'.

Still referring to FIG. 1, the two-terminal sensor 10 also includes a three-to-two-terminal interface 22. The interface 22 includes a first terminal 24 corresponding to a VCC terminal, which is provided to connect to an external power supply, and a second terminal 26 corresponding to a ground (GND) terminal, which is provided to connect to ground. The interface 22 further includes a voltage-controlled current source or sink 28 referred to more generally herein as a voltage-controlled current generating device 28. The voltage-controlled current generating device 28 is coupled to the GND terminal 26 via a ground path 30 and is coupled to the VCC terminal 24 via a supply path 32. The voltage-controlled current generating device 28 is also coupled to the output terminal 14 of the sensor 12 by a sensor output line 33. The voltage-controlled current generating device 28 receives the output voltage Vout from the sensor 12 on the sensor output line 33. The voltage-controlled current generating device 28 provides a current that is proportional to the sensor output Vout. Consequently, the generated current is proportional to the sensed magnetic field.

The GND terminal 18 of the sensor 12 is connected by a line 34 to the ground path 30 (and therefore the GND terminal 26) at a node 36. The voltage regulator 20, or the sensor 12', is coupled to the supply path 32 at a node 38. If a voltage regulator such as voltage regulator 20 is included in the two-terminal sensor 10, it may be considered part of the interface 22 or part of the sensor 12', as mentioned earlier.

Figure 2A:
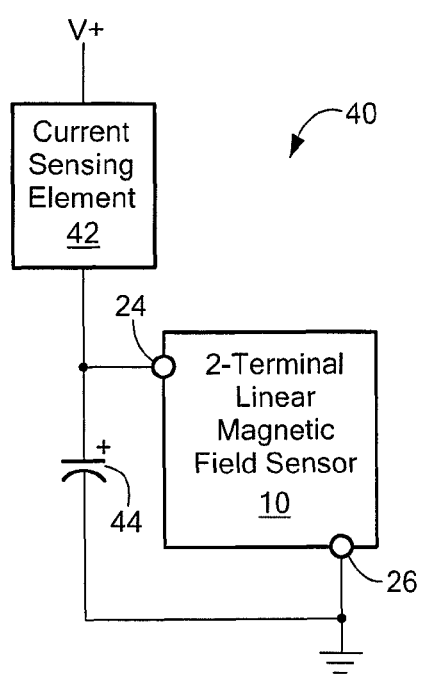
FIGS. 2A-2B show an exemplary current sensing circuit that utilizes the two-terminal linear magnetic field sensor (from FIG. 1) and in which the voltage-controlled current generating device is operable as a current sink (FIG. 2A) or a current source (FIG. 2B)
Figure 2B:
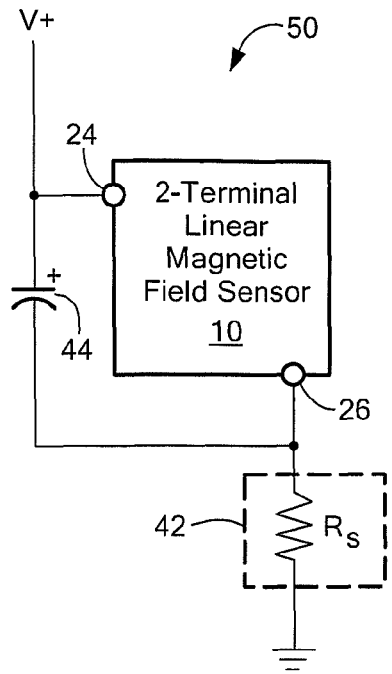

FIGS. 2A and 2B show the two-terminal sensor 10 in a current sensing circuit. FIG. 2A shows a current sensing circuit 40 configured for high side current sensing, with a current sensing element 42 connected between a power supply (labeled "V+") and the VCC terminal 24. The sensor's GND terminal 26 is connected to ground. A bypass capacitor, shown as bypass capacitor 44, may be connected between the two terminals 24, 26. FIG. 2B shows a current sensing circuit 50 configured for low side current sensing, with the current sensing element 42 connected between the sensor's GND terminal 26 and ground. In the circuit 50, the VCC terminal 24 is tied directly to the power supply. A bypass capacitor, again shown as bypass capacitor 44, may be connected between the two terminals 24, 26. Although not shown, it will be appreciated that the current sensing device 42 and the monitored circuit of interest (i.e., the two-terminal sensor 10) could be connected to the supply and ground with switches for full-range, bi-directional current sensing.

Referring to FIGS. 2A-2B in conjunction with FIG. 1, the voltage-controlled current generating device 28 of the two-terminal sensor 10 is employed as a current sink in the circuit 40 (FIG. 2A) and as a current source in the circuit 50 (FIG. 2B). Thus, the current flowing through the current sensing element 42 is sinked or sourced in proportion to the magnetic field sensed by the sensor 12 (from FIG. 1). A value indicative of the current flowing through the voltage-controlled current generating device 28 may be sensed by sensing the current through a sense resistor. Accordingly, in one embodiment, and as depicted in FIG. 2B, the current sensing element 42 of circuit 50 may be implemented with a sense resistor ("Rs"). Although not shown, the circuit element 42 of circuit 40 (FIG. 2A) may be implemented with a sense resistor Rs as well. A sense resistor Rs would develop a voltage proportional to the current flowing from the power supply to the voltage-controlled current generating device 28 in circuit 40. A sense resistor Rs in circuit 50 would develop a voltage proportional to the current flowing through the voltage-controlled current generating device 28 to ground.

Figure 3:
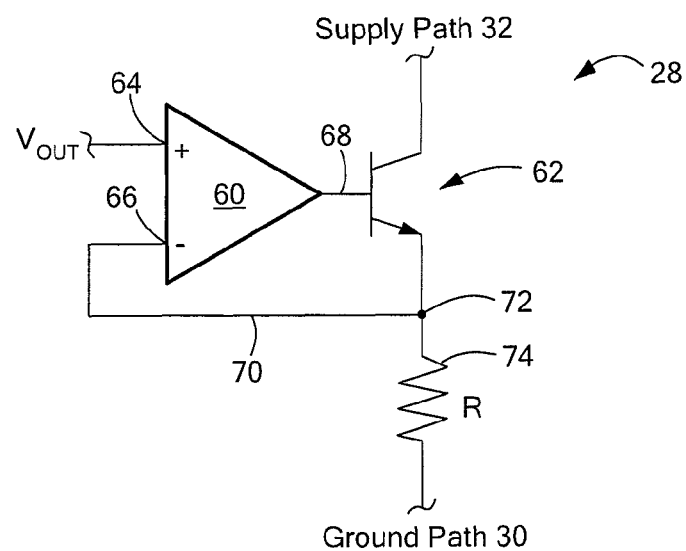
FIG. 3 shows one exemplary implementation of the voltage-controlled current generating device (from FIG. 1) that includes an operational amplifier and a bipolar junction transistor (BJT)

Referring to FIG. 3, in one exemplary implementation, the voltage-controlled current generating device 28 may be designed to include a non-inverting operational amplifier (or op-amp) 60 that is coupled to a pass element 62 such as a transistor, as shown. The pass element 62 can be bipolar, JFET, MOSFET, or a combination. In the illustrated example, the pass element 62 is shown as a bipolar junction transistor (BJT). The op-amp 60 has two inputs, a positive input 64 that receives Vout (from sensor 12) and a negative input 66, and an output 68. The output 68 is coupled to the control terminal (base) of the BJT 62. The transistor's input terminal (collector) is connected to supply path 32. A feedback loop 70 is provided between the transistor's output terminal (emitter) at node 72 and the negative input 66 of the op-amp 60. A resistor ("R") 74 is connected in series between the node 72 and the GND path 30.

The op-amp 60 receives from the sensor 12 the voltage proportional to strength of magnetic field, that is, Vout. The sensor output Vout, provided as an input to the voltage-controlled current generating device 28 at op amp input 64, operates as a control voltage for the device 28. Current flows through the transistor 62 as a function of that control voltage, i.e., proportional to the control voltage Vout. The op-amp 60 adjusts the current to the emitter of the transistor 62 so that it remains equal to Vout/R. When connected in a negative feedback configuration, as shown, the op-amp 60 will try to make the output 68 whatever voltage is necessary to make the voltages at inputs 64 and 66 as nearly equal as possible. In other words, the op amp feedback loop 70 forces the output current flowing through the transistor 62 to be proportional to Vout. For this example implementation, the transfer function of the two-terminal sensor 10 would be given by Vout/R*Rs.

The two-terminal sensor 10 therefore sources or sinks current directly proportional to the magnetic field sensed by the internal sensor 12. The current can be measured by some technique, such as using a current sensing element like current sensing element 42, e.g., a sense resistor, as illustrated in FIG. 2A-2B, in conjunction with a control device. When the current sensing element is a sense resistor (as shown in FIG. 2B), the control device would be used to measure the voltage across the sense resistor. The control device may be part of or coupled to an application microcontroller or microprocessor. The control device could be configured to continuously monitor the sense resistor.

Potential applications include, for example, control modules that perform various measurement and/or control functions. The current sensing element, e.g., a sense resistor, as described above, in an application control module would allow for the interpretation of the sensor output using the control device. The control device could be a simple device such as a comparator. In an application, the two-terminal sensor 10 could be used for any type of linear magnetic field sensing, such as current sensing, motor control and position/displacement sensing, to give but a few examples.

The current sensing element 42 can be located near the control device while the two-terminal linear magnetic field sensor 10 is located elsewhere in the application. The use of a two-terminal linear magnetic field sensor reduces the number of interconnections required to obtain the same information available from a three-terminal linear magnetic field sensor. The elimination of an interconnection (which might require, for example, a wire, cable, printed circuit board trace or other interconnecting component) can reduce overall system cost as well as save space.

Figure 4:
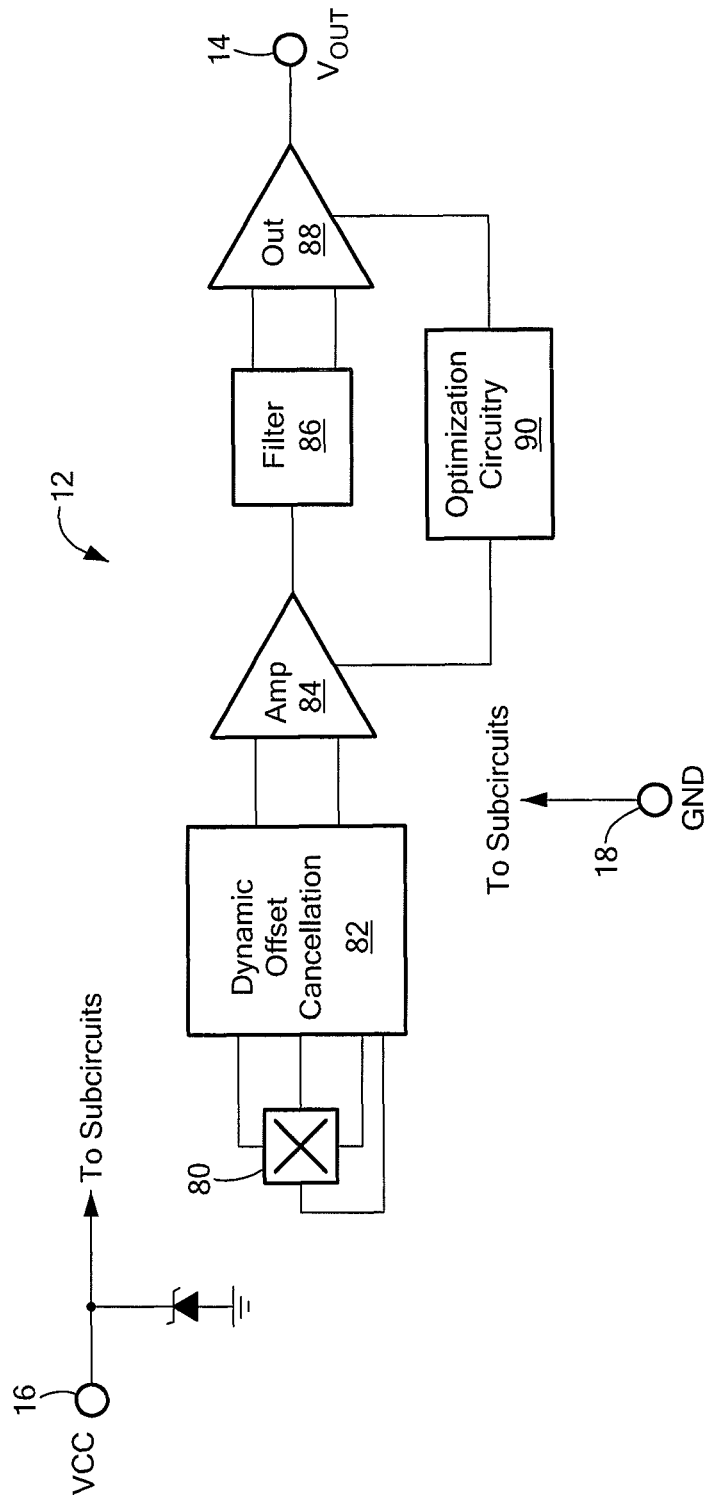
FIG. 4 shows an example of a three-terminal linear magnetic field sensor for use in a two-terminal linear magnetic field sensor like that shown in FIG. 1.

Referring to FIG. 4, a simplified example of the three-terminal linear magnetic field sensor 12 (from FIG. 1) is shown. In the illustrated example, the sensor 12 is a Hall-effect sensor. It includes a Hall sensing device 80 having at least one Hall-Effect sensing element, as well as various signal conditioning and peripheral components to make the sensed signal usable to applications. For example, and as shown in the figure, the sensor 12 can include dynamic offset cancellation circuitry 82 (for chopper stabilization), an amplifier stage 84, a filter 86 and an output stage 88 to provide the voltage signal Vout at the output terminal 14. The sensor 12 may include other features, such as temperature compensation, internal gain and offset trim adjustment, represented generally by optimization circuitry block 90. Other Hall sensor designs could instead be used. Although a Hall-effect device is illustrated, the design of the internal sensor 12 may be based on any type of linear magnetic field sensor architecture. Thus, the sensing device could also be implemented with, for example, a magnetoresistive (MR) or other type of magnetic field sensing element (or elements). The MR element may be made from any type of MR device, including, but not limited to: a anisotropic magnetoresistance (AMR) device; a giant magnetoresistance (GMR) device, including unpinned sandwich, antiferromagnetic multilayers and spin valve; a magnetic tunnel junction (MTJ, also known as spin-dependent tunneling or "SDT") device; and a tunneling magnetoresistance (TMR) device. The linear magnetic field sensor architecture of sensor 12 could be designed to provide either an analog output signal or its equivalent (for example, an output signal that digitally encodes analog signal levels, such as a pulse width modulation signal).

Although the sensor 12 is described as a "linear" sensor, it will be understood that the sensor may exhibit linear and/or non-linear behavior. If the linear sensor exhibits non-linear behavior, the output voltage may be adjusted so that it is proportional to the sensor input, that is, the output voltage provided as Vout 14 is one that has been "linearized". This linearization may be achieved with appropriate signal conditioning, conversion or other techniques. In the example implementation shown in FIG. 4, the linearization may be handled by block 90. Nevertheless, it can be said that the sensor 12 produces an output voltage that is proportional to the sensed magnetic field. Alternatively, or in addition, it may be desirable to allow the output voltage provided as Vout 14 to be a continuous, non-linear output.

Although the embodiments discussed above relate the transducer 10 to magnetic field sensing, a transducer with a two-terminal interface as described above can be applied to other types of sensing and measurement as well.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit comprising:
a linear magnetic field sensor comprising an integrated circuit having only two terminals, one a power supply terminal and the other a ground terminal, wherein a current proportional to a magnetic field sensed by the linear magnetic field sensor is provided at at least one of the power supply terminal and the ground terminal; and
a current sensing device, connected to the linear magnetic field sensor, usable to measure the current provided by the linear magnetic field sensor.

2. The circuit of claim 1, wherein the current sensing device is connected between the power supply terminal and a power supply.

3. The circuit of claim 2 wherein the linear magnetic field sensor comprises a voltage-controlled current generating device operable as a voltage-controlled current sink.

4. The circuit of claim 1, wherein the current sensing device is connected between the ground terminal and ground.

5. The circuit of claim 4 wherein the linear magnetic field sensor comprises a voltage-controlled current generating device operable as a voltage-controlled current source.

6. The circuit of claim 1 wherein the current sensing device comprises a resistor.

7. The circuit of claim 1 wherein the linear magnetic field sensor comprises a Hall-effect element to sense the magnetic field.

8. The circuit of claim 1 wherein the linear magnetic field sensor comprises a magnetoresistive element to sense the magnetic field.

9. A method comprising:
using a linear magnetic field sensor to produce a current that is proportional to a sensed magnetic field, the linear magnetic field sensor comprising an integrated circuit having only two terminals including a power supply terminal and a ground terminal, wherein the current is provided at at least one of the power supply terminal and the ground terminal; and
measuring the current.

* * * * *

UNITED STATES PATENT AND TRADEMARK OFFICE
CERTIFICATE OF CORRECTION

| | | |
|---|---|---|
| PATENT NO. | : 8,773,123 B2 | Page 1 of 1 |
| APPLICATION NO. | : 13/239587 | |
| DATED | : July 8, 2014 | |
| INVENTOR(S) | : Michael C. Doogue et al. | |

It is certified that error appears in the above-identified patent and that said Letters Patent is hereby corrected as shown below:

In the specification

Column 4, Line 7, delete "op amp" and replace with -- op-amp --.

Column 4, Line 16, delete "op amp" and replace with -- op-amp --.

Column 4, Line 25, delete "FIG. 2A-2B," and replace with -- FIGS. 2A-2B, --.

Signed and Sealed this
Twenty-fourth Day of November, 2015

Michelle K. Lee
*Director of the United States Patent and Trademark Office*